United States Patent
Okada

(10) Patent No.: US 9,490,758 B2
(45) Date of Patent: Nov. 8, 2016

(54) POWER AMPLIFIER

(71) Applicant: PANASONIC CORPORATION, Osaka (JP)

(72) Inventor: Eiji Okada, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 80 days.

(21) Appl. No.: 14/379,651

(22) PCT Filed: Dec. 19, 2013

(86) PCT No.: PCT/JP2013/007492
§ 371 (c)(1),
(2) Date: Aug. 19, 2014

(87) PCT Pub. No.: WO2014/103265
PCT Pub. Date: Jul. 3, 2014

(65) Prior Publication Data
US 2015/0015338 A1 Jan. 15, 2015

(30) Foreign Application Priority Data
Dec. 25, 2012 (JP) ................. 2012-280974

(51) Int. Cl.
H03F 3/217 (2006.01)
H03F 3/21 (2006.01)
(Continued)

(52) U.S. Cl.
CPC ............ *H03F 3/211* (2013.01); *H03F 3/2178* (2013.01); *H03F 3/245* (2013.01); *H03F 3/04* (2013.01);
(Continued)

(58) Field of Classification Search
CPC ............... H03F 2200/451; H03F 3/19; H03F 3/45179; H03F 1/0211; H03F 1/0216; H03F 1/0227; H03F 1/0233; H03F 1/42; H03F 2200/102; H03F 2200/129; H03F 2200/231; H03F 2200/555; H03F 2203/21127
USPC ......................... 330/251, 288, 296
See application file for complete search history.

(56) References Cited

U.S. PATENT DOCUMENTS 6,654,916 B1    11/2003  Furukawa
7,567,126 B2 *  7/2009   Arai ................. H03F 1/301
                                                 330/285
(Continued)

FOREIGN PATENT DOCUMENTS

CN    1573854 A     2/2005
CN    102238119 A   11/2011
(Continued)

OTHER PUBLICATIONS

International Search Report for Application No. PCT/JP2013/007492 dated Mar. 4, 2014.

*Primary Examiner* — Khanh V Nguyen
(74) *Attorney, Agent, or Firm* — Pearne & Gordon LLP

(57) ABSTRACT

There is provided a power amplifier capable of readily reducing odd-order harmonic waves even in high frequencies. This power amplifier includes n current sources (where "n" is a natural number equal to or greater than 3) that cause predetermined currents to flow; n switches that open and close current paths of the n current sources, respectively; and a signal generating section that generates n timing signals for turning on/off the n switches, respectively. In the power amplifier, the n timing signals are signals that have an identical duty ratio and that are different in phase; and the power amplifier outputs a signal amplified in power based on the currents flowing through the n current sources.

12 Claims, 12 Drawing Sheets

(51) Int. Cl.
   *H03F 3/24* (2006.01)
   *H03F 3/345* (2006.01)
   *H03F 3/04* (2006.01)

(52) U.S. Cl.
   CPC ........... *H03F 3/345* (2013.01); *H03F 2200/18* (2013.01); *H03F 2200/432* (2013.01); *H03F 2203/21109* (2013.01); *H03F 2203/21136* (2013.01); *H03F 2203/21145* (2013.01); *H03F 2203/21184* (2013.01)

(56) References Cited

U.S. PATENT DOCUMENTS

| | | | |
|---|---|---|---|
| 7,755,421 B2 * | 7/2010 | Chen | H03F 3/45973 |
| | | | 330/9 |
| 7,924,096 B2 * | 4/2011 | Patterson | H03F 3/4508 |
| | | | 330/257 |
| 8,183,916 B2 * | 5/2012 | Byon | H03F 3/45928 |
| | | | 330/69 |
| 8,519,786 B2 * | 8/2013 | Jang | H03G 1/0088 |
| | | | 330/282 |
| 8,525,586 B2 * | 9/2013 | Chen | H03G 1/04 |
| | | | 330/254 |
| 8,712,350 B2 * | 4/2014 | Frambach | H03F 3/193 |
| | | | 455/127.1 |
| 2002/0180547 A1 | 12/2002 | Staszewski et al. | |
| 2004/0239668 A1 | 12/2004 | Morosawa et al. | |
| 2008/0180175 A1 * | 7/2008 | Arai | H03F 1/301 |
| | | | 330/277 |
| 2011/0037502 A1 | 2/2011 | Nakano et al. | |
| 2011/0267127 A1 | 11/2011 | Staszewski et al. | |

FOREIGN PATENT DOCUMENTS

| | | |
|---|---|---|
| JP | 04-256882 A | 9/1992 |
| JP | 2000-323966 A | 11/2000 |
| JP | 2003-143023 A | 5/2003 |
| JP | 2004-363887 A | 12/2004 |
| JP | 2011-41105 A | 2/2011 |
| JP | 2011-234348 A | 11/2011 |
| JP | 2012-069616 A | 4/2012 |
| WO | 2008/032782 A1 | 3/2008 |

* cited by examiner

POWER AMPLIFIER

TECHNICAL FIELD

The present invention relates to a power amplifier.

BACKGROUND ART

Examples of a circuit that outputs a large amplitude signal in order to emit a radio wave from an antenna include a power amplifier.

As illustrated in FIG. 10, as a power amplifier, there has been widely used a circuit that includes N channel MOS transistor 801, inductor 802, and band-pass filter 803 and that is configured to use a pulse wave as an input signal. In this configuration, however, the output signal of the power amplifier becomes a signal that is similar to a pulse waveform and that includes a harmonic wave component.

As illustrated in FIG. 11, there is another pulse power amplifier that uses an inverter including N channel MOS transistor 902 and P channel MOS transistor 901. This configuration also generates output including a harmonic wave.

Conventionally, a power amplifier has been proposed that independently sets the duty ratio and phase of an input pulse wave of each of a plurality of amplifiers and that combines the output of the plurality of amplifiers, in order to reduce odd-order harmonic waves in particular (for example, see Patent Literature (hereinafter, abbreviated as PTL) 1).

FIG. 12 is a circuit diagram of the power amplifier described in PTL 1, and FIG. 13 is a timing chart illustrating the signal waveform of each component of the power amplifier in FIG. 12. The power amplifier in FIG. 12 combines the output of an inverter including N channel MOS transistor 1001 and P channel MOS transistor 1002, and the output of an inverter including N channel MOS transistor 1003 and P channel MOS transistor 1004 to form an output signal. As illustrated in FIG. 13, the duty ratios and phases of timing signals A10, B10, and C10 to respective components are independently set to thereby make the output waveform similar to a sine wave and thus to reduce odd-order harmonic waves.

CITATION LIST

Patent Literature

PTL 1
International Publication WO 2008/032782

SUMMARY OF INVENTION

Technical Problem

However, the power amplifier in FIG. 12 needs a timing generating circuit that generates multiple timing signals A10, B10, and C10, which have different duty ratios, for reducing harmonic waves. As described in PTL 1, the timing generating circuit is a circuit provided by combining logical circuits such as AND circuits or OR circuits. As a result, in the timing generating circuit, the influence of delay due to elements or interconnection increases in higher frequency signals, and the rising and falling timings of a timing signal deviate from an ideal timing. Therefore, the power amplifier in FIG. 12 has a problem in that the gap of the timing signal decreases the reduction amount of odd-order harmonic waves.

It is an object of the present invention to provide a power amplifier that can readily reduce odd-order harmonic waves even in high frequencies.

Solution to Problem

A power amplifier according to an aspect of the present invention includes: n current sources (where "n" is a natural number equal to or greater than 3) that cause predetermined currents to flow; n switches that open and close current paths of the n current sources, respectively; and a signal generating section that generates n timing signals for turning on/off the n switches, respectively, in which: the n timing signals are signals that have an identical duty ratio and that are different in phase; and the power amplifier outputs a signal amplified in power based on the currents flowing through the n current sources.

Advantageous Effects of Invention

According to the present invention, n timing signals have the same duty ratio, so that odd-order harmonic waves can readily be reduced even in high frequencies.

DESCRIPTION OF EMBODIMENTS

Each embodiment of the present invention will be explained below in detail with reference to the accompanying drawings.

(Embodiment 1)

Figure 1:
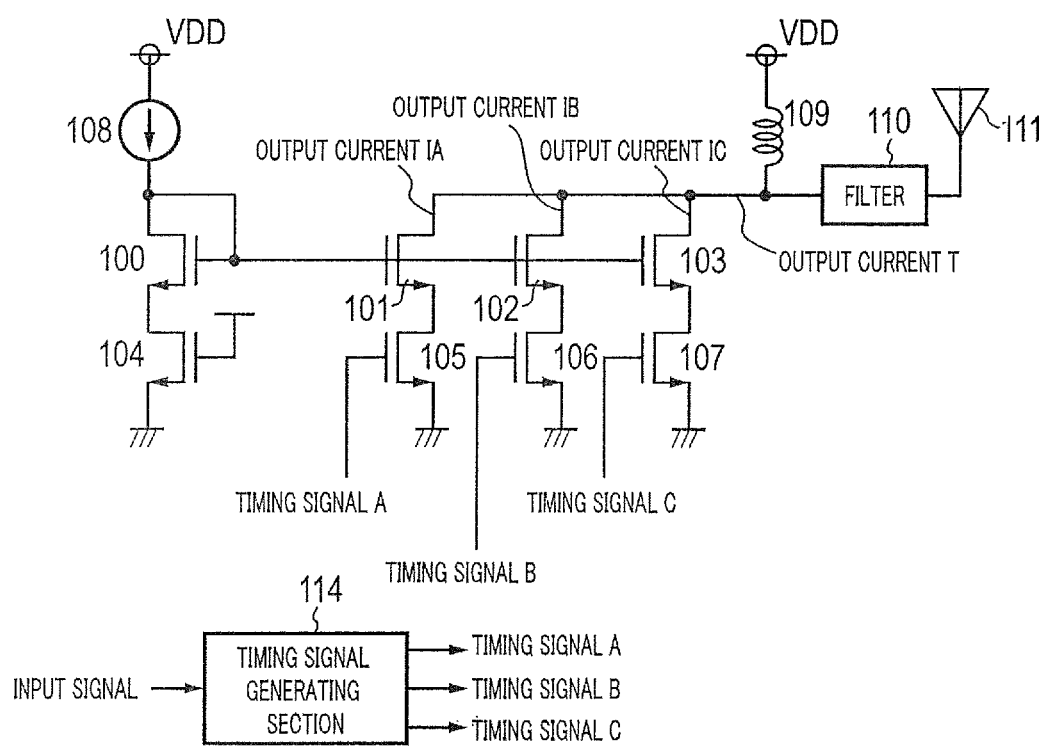
FIG. 1 is a configuration diagram of a power amplifier according to Embodiment 1 of the present invention.

FIG. 1 is a configuration diagram of a power amplifier according to Embodiment 1 of the present invention.

As illustrated in FIG. 1, the power amplifier in Embodiment 1 includes reference current source 108, a plurality of NMOS transistors (N-channel Metal-Oxide-Semiconductor Field-Effect Transistors) 100 to 103 constituting a current mirror circuit, a plurality of NMOS transistors 104 to 107 as switches, pull-up coil 109, band passage filter 110, and timing signal generating section 114. The power amplifier has an output terminal connected to antenna 111 and outputs a large amplitude current to antenna 111.

In FIG. 1, reference current source 108 and NMOS transistors 100, 101, 102, and 103 constitute the current mirror circuit. Reference current source 108 is, for example, a constant current source. When a voltage equal to or more than a predetermined value is applied between the drain and source of each of NMOS transistors 101, 102, and 103, the transistors transfer a current flowing through NMOS transistor 100, which is a transfer source, at a predetermined mirror ratio, and cause a current to flow through themselves. The three current mirror circuit sets (100, 101), ((100, 102), (100, 103)) are equivalent to three current sources.

NMOS transistors 101, 102, and 103 have respective drain terminals connected to the pull-up terminal of coil 109 and the input terminal of band pass filter 110. The other end of band pass filter 110 is the output terminal of the power amplifier, the output terminal being connected to antenna 111.

NMOS transistors 105, 106, and 107 are switches and are turned on/off by timing signals A, B, and C sent from timing signal generating section 114. NMOS transistors 105, 106, and 107 are connected, respectively between the source terminals and the grounds of NMOS transistors 101, 102, and 103 that cause the flow of transfer currents, and that open and close these current paths. NMOS transistor 104 of the transfer source circuit is a dummy switch for equalizing the characteristics of the transfer destination and the transfer source, and is always turned on.

NMOS transistors 101, 102, and 103 are formed to have the W/L ratio equal to $1:2^{1/2}:1$ so that the ratio of currents flowing through the respective transistors is set to $1:2^{1/2}:1$, where W represents the gate width of the transistor, and L represents the gate length.

Timing signal generating section 114 generates timing signals A, B, and C for turning on/off NMOS transistors 105, 106, and 107 that are switches. Timing signal generating section 114 modulates the frequency of timing signals A, B, and C according to an input signal, and thereby modulates the frequency of the output current of the power amplifier.

Coil 109 is sufficiently low in resistance for DC current and sufficiently high in resistance for high frequencies. Coil 109 supplies a DC current from electric source line VDD to the circuit during the operation of the power amplifier. Only a direct current component of output current IT, which is a total of the currents flowing through NMOS transistors 101, 102, and 103, flows through coil 109 and a high frequency component is outputted to antenna 111 through band pass filter 110.

Figure 2:
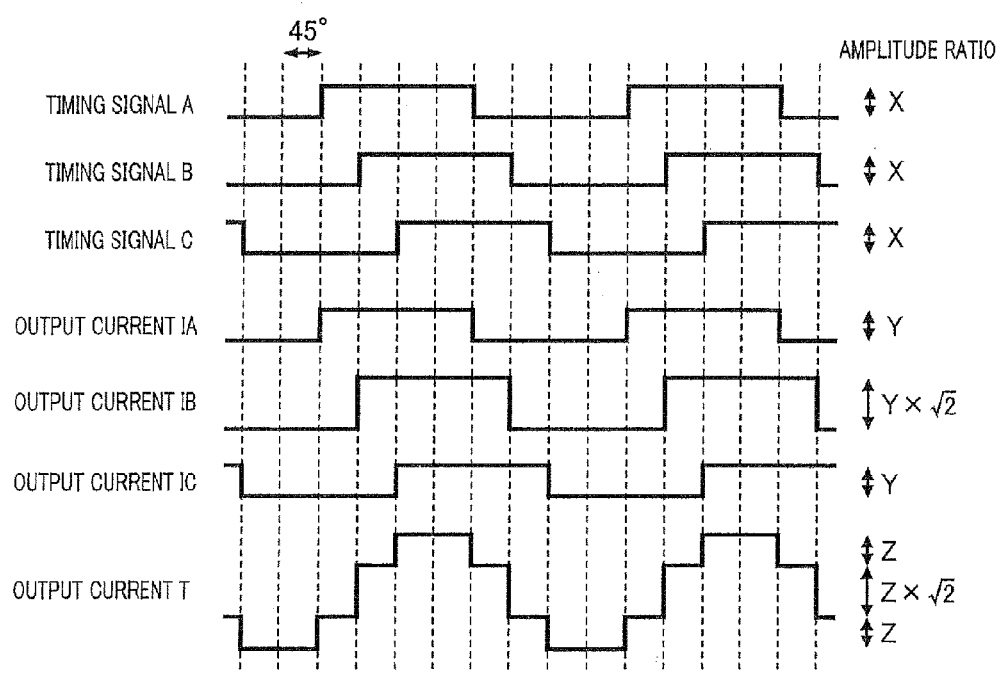
FIG. 2 is a timing chart illustrating the operation of the power amplifier of Embodiment 1 of the present invention.

FIG. 2 is a timing chart illustrating an operation of the power amplifier of Embodiment 1.

As illustrated in FIG. 2, timing signal A, timing signal B, and timing signal C each have duty ratios of 50% and are signals having phases shifted by 45 degrees. For example, timing signal A, timing signal B, and timing signal C, are signals that rise at phases of 0 degree, −45 degrees, and −90 degrees, respectively. Timing signal A, timing signal B, and timing signal C also have equal high level voltage values.

Output currents IA, IB, and IC flowing through drain terminals of NMOS transistors 101, 102, and 103 have waveforms having predetermined current values while timing signals A, B, and C have a high level, respectively. Since the W/L ratios of NMOS transistors 101, 102, and 103 are set as $1:2^{1/2}:1$ as described above, the amplitudes of output currents IA, IB, and IC are set as $1:2^{1/2}:1$.

Output current IT is a total of output currents IA, IB, and IC, and high frequency components are outputted to antenna 111 through band pass filter 110. Since timing signal A, timing signal B, and timing signal C have phases shifted by 45 degrees, the relationship of the third and fifth harmonic waves of output currents IA, IB, and IC involves output current IB having a reverse phase to a total current of output current IA and output current IC. Moreover, the amplitude of output current IB is output current IA multiplied by $2^{1/2}$ and is therefore equal to the amplitude of a total current of output current IA and output current IC. Therefore, the third and fifth harmonic waves of output currents IA, IB, and IC are canceled out. The waveform of output current IT has spectrum indicating a reduction in the third and fifth harmonic wave components.

As described above, the power amplifier according to Embodiment 1 can provide output current IT including reduced odd-order harmonic waves using a plurality of timing signals A, B, and C having the same duty ratio and shifted phases. Therefore, a duty conversion circuit is unnecessary, so that the circuit scale decreases, and a phase error decreases as well. Thus, odd-order harmonic waves can be readily reduced even in high frequencies.

Moreover, since the power amplifier of Embodiment 1 has an open drain configuration, high electric power can be outputted by setting a large voltage amplitude of an output signal.

The specific configuration illustrated in FIG. 1 can be changed in various manners.

Figure 3:
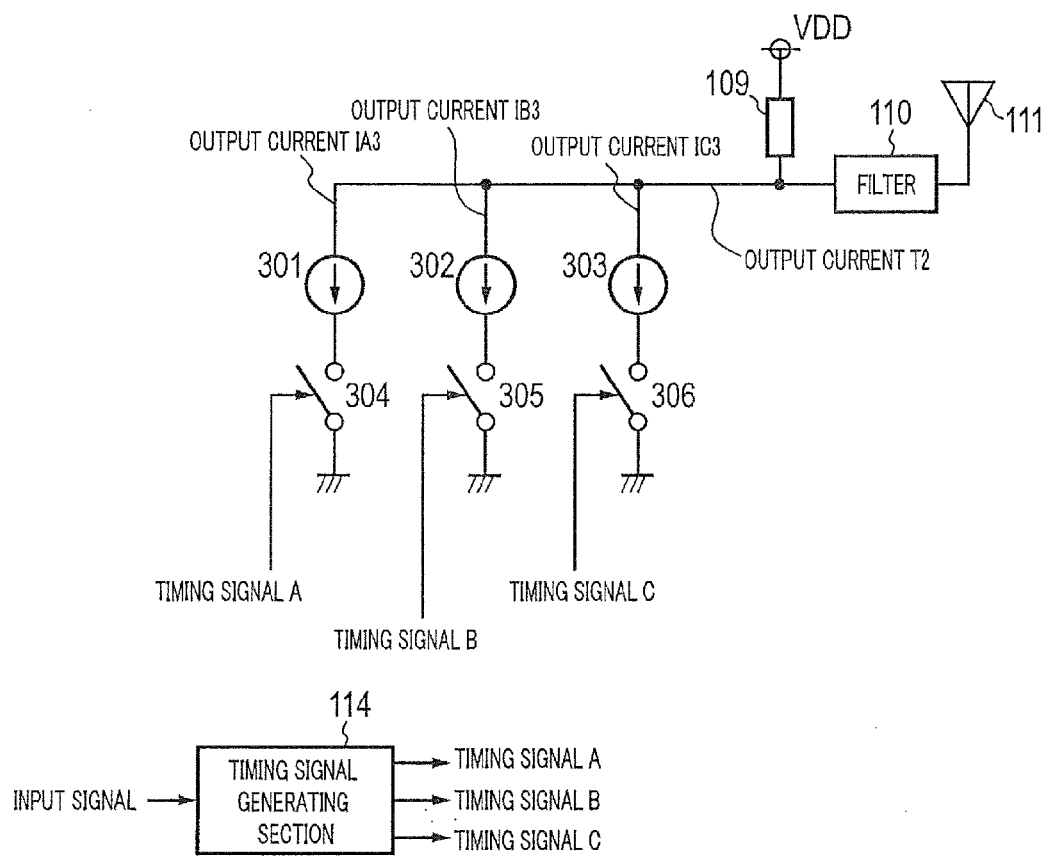
FIG. 3 is a conceptual diagram of the power amplifier according to Embodiment 1 of the present invention.

FIG. 3 is a conceptual diagram of the power amplifier according to Embodiment 1 of the present invention.

For example, the power amplifier of FIG. 1 includes three sets of current mirror circuits ((100, 101), (100, 102), (100, 103)) as three current sources, but may include any types of current sources 301, 302, and 303 having the same function as illustrated in FIG. 3. The power amplifier of FIG. 1 includes three NMOS transistors 105, 106, and 107 as three switches, but may include elements 304, 305, and 306 having the same function, such as bipolar transistors.

Figure 4:
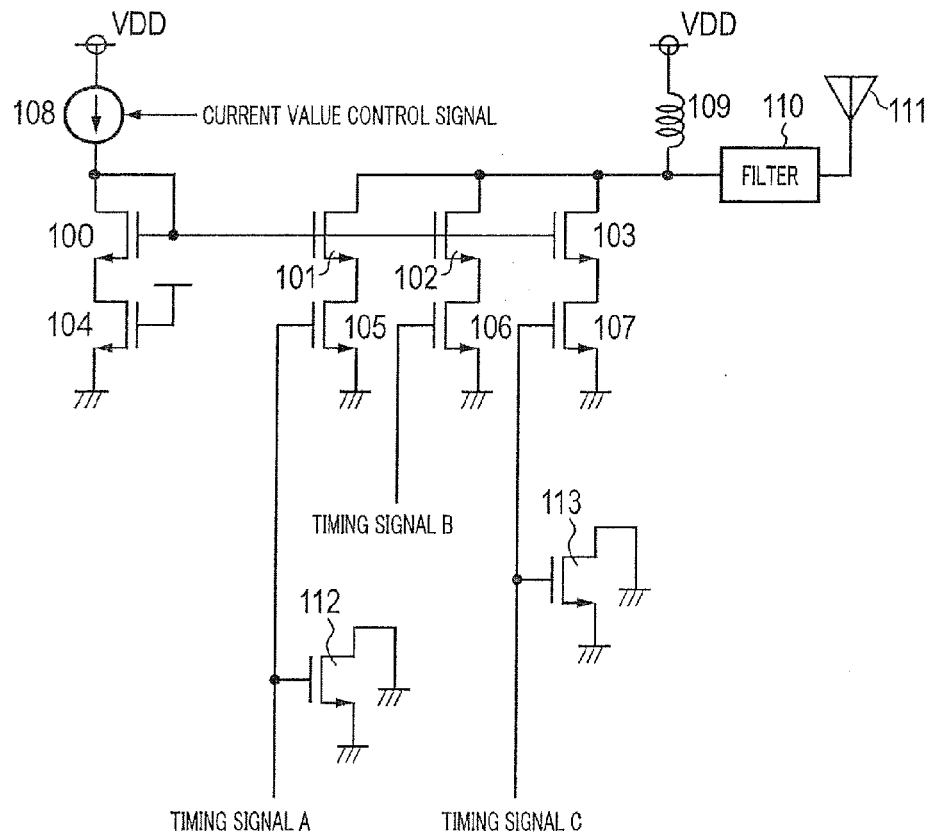
FIG. 4 is a configuration diagram of a variation of Embodiment 1 of the present invention.

FIG. 4 is a configuration diagram of a current amplifier according to a variation of Embodiment 1.

The power amplifier of FIG. 1 has been explained in which the current amount of reference current source 108 is fixed. Alternatively, the current amount of the reference current source 108 may be adjusted with a current value control signal, as illustrated in FIG. 4. This configuration can vary the amplitude of output current T. A variation in the amplitude can be used for switching of the signal level or the amplitude modulation of a transmission signal.

Figure 5:
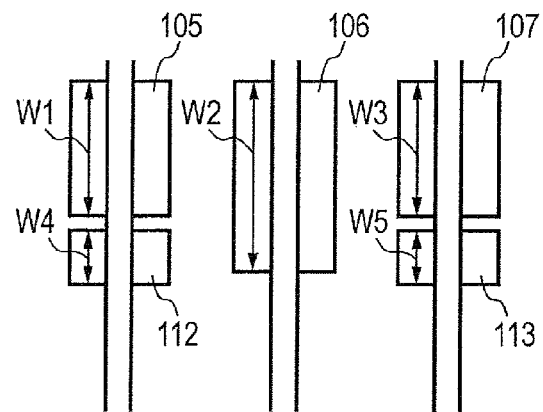
FIG. 5 is a schematic diagram explaining the size of NMOS transistors in FIG. 4.

FIG. 5 is a schematic diagram explaining the size of the NMOS transistors in FIG. 4.

In the power amplifier of FIG. 1, NMOS transistors 104, 105, 106, and 107, which are switches, may be designed to have the sizes of channels according to the ratio of current values in order to equalize the current densities of currents flowing through the respective transistors. For example, as illustrated in FIG. 5, the gate widths W1, W2, and W3 of NMOS transistors 105, 106, and 107 may be set to $1:2^{1/2}:1$ (the gate lengths are fixed) according to the ratio of the current values $1:2^{1/2}:1$.

However, when this configuration is employed, the gate loads (parasitic capacitance) of NMOS transistors 105, 106, and 107, which are switches, are not equal. As a result, if timing signals A, B, and C are generated on the same conditions, the rising and falling waveforms of timing signals A, B, and C may be changed and cause an error in the on/off timings of NMOS transistors 105, 106, and 107.

In this respect, the configuration in FIG. 5 may be employed in order to prevent this timing error. The configuration in FIG. 5 includes MOS transistors 112 and 113 for load adjustment having the sizes compensating for the difference between the sizes corresponding to NMOS transistors 105 and 107, respectively, having small sizes. NMOS transistors 105 and 107 have gate terminals connected to the gate terminals of load adjustment MOS transistors 112 and 113, respectively. Load adjustment MOS transistors 112 and 113 also have source and drain terminals connected to the same potential point (for example, the ground) so that no current flows through load adjustment MOS transistors 112 and 113.

Gate width W4 and W5 of load adjustment MOS transistors 112 and 113 may be set as, for example, W1+W4≈W2≈W3+W5 when load adjustment MOS transistors 112 and 113 have the same gate lengths NMOS transistors 105, 106, and 107.

This configuration almost equalizes the loads (capacitance) of three gate lines of NMOS transistors 105, 106, and 107 when viewed from timing signal generating section 114. Timing signals A, B, and C generated on the same condition enable turning on/off NMOS transistors 105, 106, and 107 without a timing error.

(Embodiment 2)

Figure 6:
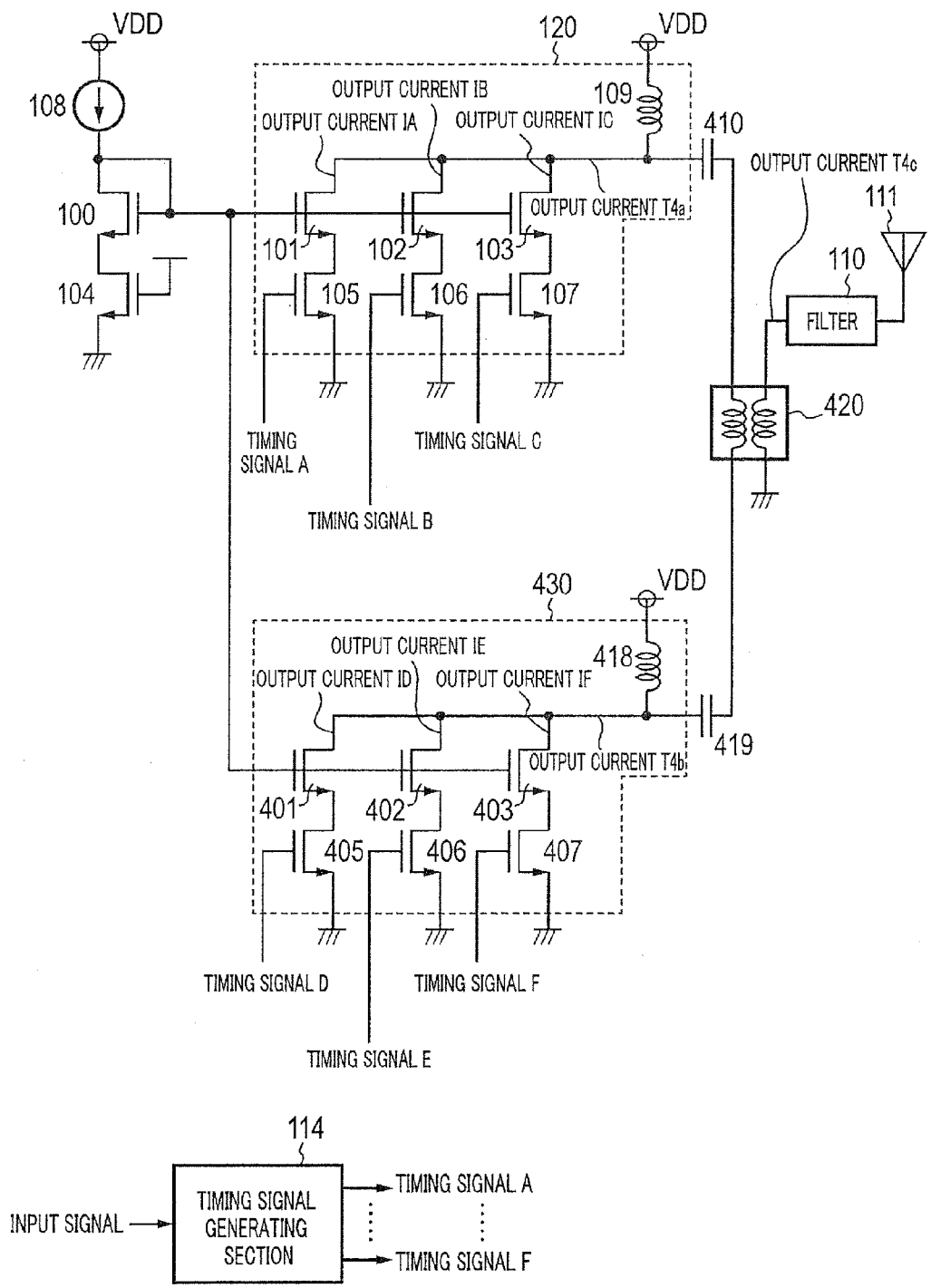
FIG. 6 is a configuration diagram of a power amplifier according to Embodiment 2 of the present invention.

FIG. 6 is a configuration diagram of a power amplifier according to Embodiment 2 of the present invention. In FIG. 6, similar elements to those in FIG. 1 are assigned the same reference numerals, and explanations thereof will be omitted.

As illustrated in FIG. 6, the power amplifier of Embodiment 2 includes, in addition to the configuration in FIG. 1, capacitors 410 and 419, and balun 420, and inverting section (corresponding to a second group) 430 that has a similar configuration to non-inverting section (corresponding to a first group) 120 as a part of circuit of FIG. 1 and that operates with an opposite phase.

Inverting section 430 includes three NMOS transistors 401, 402, and 403 that constitute a current mirror circuit, three NMOS transistors 405, 406, and 407 that are switches, and pull-up coil 418. These elements are configured in the same manner as those of non-inverting section 120 except for the operation with an opposite phase.

Reference current source 108 and NMOS transistor 100 that cause the flow of the reference current of the transfer source are common to inverting section 430 and non-inverting section 120. That is, the gate terminals of NMOS transistors 401, 402, and 403 that serve as current sources in inverting section 430 are connected to the gate terminal of NMOS transistor 100 that causes the flow of the reference current.

Capacitors 410 and 419 connect both output terminals of non-inverting section 120 and inverting section 430 in a high frequency manner. High frequency components of a differential current of output current T4a of non-inverting section 120 and output current T4b of inverting section 430 flow through a signal line that connects capacitors 410 and 419. Capacitors 410 and 419 are connected to both output terminals of non-inverting section 120 and inverting section 430 in order for non-inverting section 120 and inverting section 430 to be configured in a symmetric manner.

Balun (balanced-unbalance converter) 420 couples a signal line, through which the differential current of non-inverting section 120 and inverting section 430 flows, and an input signal line of band pass filter 110 in a high frequency manner, and sends the output signals of non-inverting section 120 and inverting section 430 to band pass filter 110.

Timing signal generating section 114 generates timing signals A, B, and C for turning on/off NMOS transistors 105, 106, and 107 in non-inverting section 120, and timing signals D, E, and F that turn on/off NMOS transistors 405, 406, and 407 in inverting section 430.

The connection and configuration of the circuit in FIG. 6 will be more specifically described below.

The drain terminals of NMOS transistors 401, 402, and 403 are connected to one terminal of pull-up coil 418 having the other terminal connected to electric source line VDD and one terminal of capacitor 419. The other terminal of capacitor 419 is connected to one terminal on the balance side of balun 420. The other terminal of the balance side of balun 420 is connected to one terminal of capacitor 410 having the other terminal connected to the drain terminals of NMOS transistors 101, 102, and 103.

The terminal on the unbalance side of balun 420 is connected to the input terminal of band pass filter 110, and the output terminal of band pass filter 110 is connected to antenna 111.

NMOS transistors 101, 102, 103, 401, 402, and 403 are formed to have the W/L ratio equal to $1:2^{1/2}:1:1:2^{1/2}:1$ so that the ratio of currents flowing through the respective transistors are set to $1:2^{1/2}:1:1:2^{1/2}:1$, where W represents the gate width of the transistor, and L represents the gate length.

Figure 7:
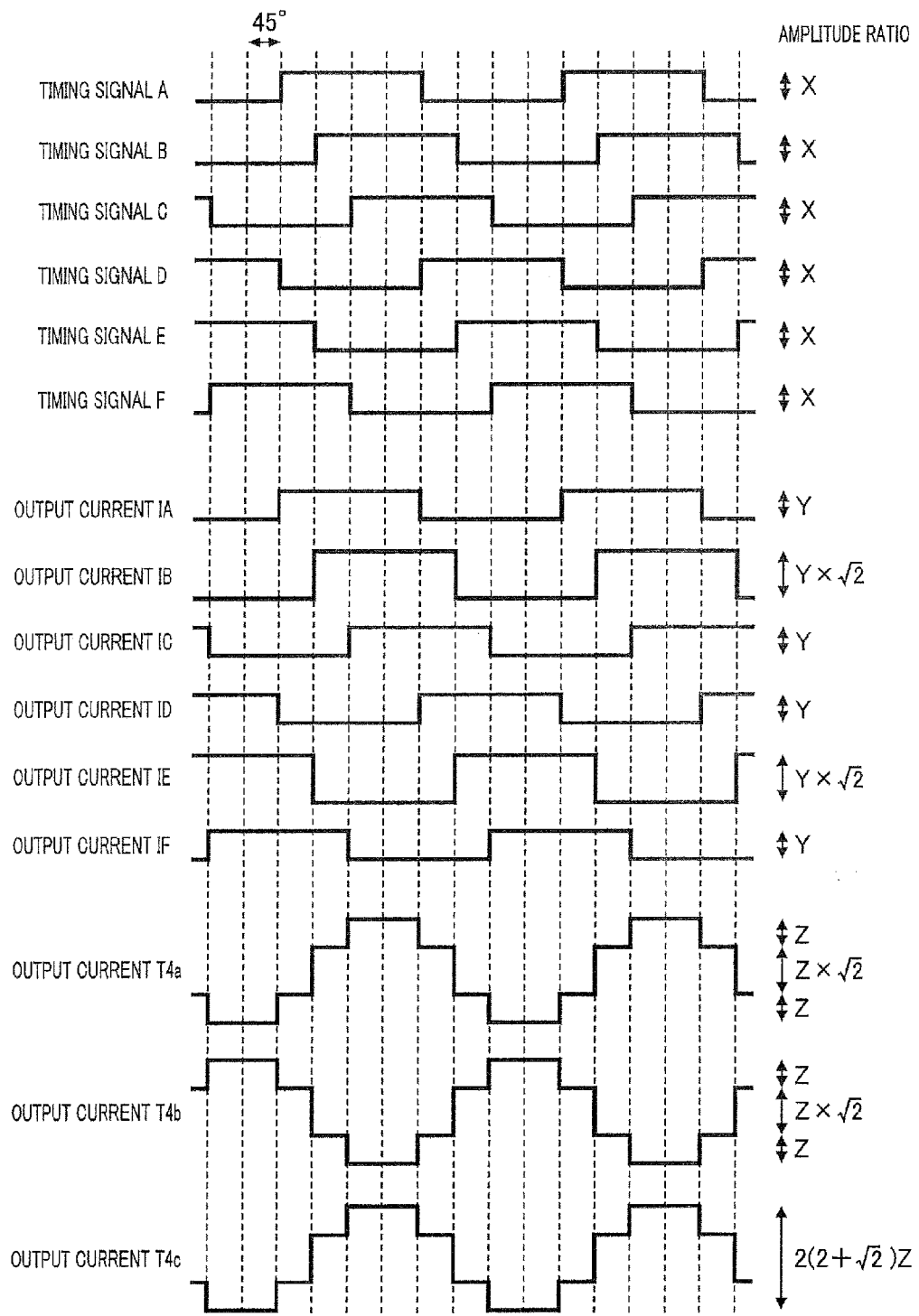
FIG. 7 is a timing chart illustrating the operation of the power amplifier of Embodiment 2 of the present invention.

FIG. 7 is a timing chart illustrating the operation of the power amplifier of Embodiment 2.

Timing signal A, timing signal B, timing signal C, timing signal D, timing signal E, and timing signal F each have a duty ratio of 50%, and have a phase relation as follows.

Phases of timing signal A=phase of timing signal B+45 degrees=phases of timing signal C+90 degrees Phases of timing signal D=phase of timing signal E+45 degrees=phases of timing signal F+90 degrees Phase of timing signal A=phases of timing signal D+180 degrees Phase of timing signal B=phases of timing signal E+180 degrees Phase of timing signal C=phases of timing signal F+180 degrees Timing signal A, timing signal B, timing signal C, timing signal D, timing signal E, and timing signal F are signals for turning on/off NMOS transistors 105, 106, 107, 405, 406, and 407, and have phases shifted by 45 degrees in this order. For example, timing signals A, B, C, D, E, and F have shifted phases of 0, −45, −90, −180, −225, and −270, respectively.

The currents flowing through the drain terminals of NMOS transistors 101, 102, 103, 401, 402, and 403 have waveforms indicated as output currents IA, IB, IC, ID, IE, and IF, respectively, as illustrated in FIG. 7. Since the W/L ratios of the NMOS transistors are set as $1:2^{1/2}:1:1:2^{1/2}:1$ as described above, the currents are also set as $1:2^{1/2}:1:1:2^{1/2}:1$.

Output current T4a is a total of the currents through NMOS transistors 101, 102, and 103, and output current T4b is a total of the currents through NMOS transistors 401, 402, and 403.

Output current T4c has a waveform after conversion from a balance signal into an unbalance signal through balun 420. The waveform of output current T4c has a spectrum indicating that the third and fifth harmonic wave components are reduced similarly to Embodiment 1 and that even-order harmonic wave components are further reduced by the differentiation.

As described above, the power amplifier of Embodiment 2 can reduce even-order harmonic wave components in addition to odd-order harmonic wave components by the differentiation. Furthermore, since non-inverting section 120 and inverting section 430, which operate with mutually opposite phases, have the same configuration, a relative variation in the elements between these sections decreases, and thus, even-order harmonic wave components can be reduced, appropriately.

Moreover, the power amplifier of Embodiment 2 can output high electric power by the differentiation, in comparison with an inverter type power amplifier that uses NMOS transistors and PMOS (P channel MOS) transistors.

The power amplifier of Embodiment 2 may also be provided by similarly applying the variation illustrated in FIG. 4 and FIG. 5, and thereby can provide a similar effect.

(Embodiment 3)

Figure 8:
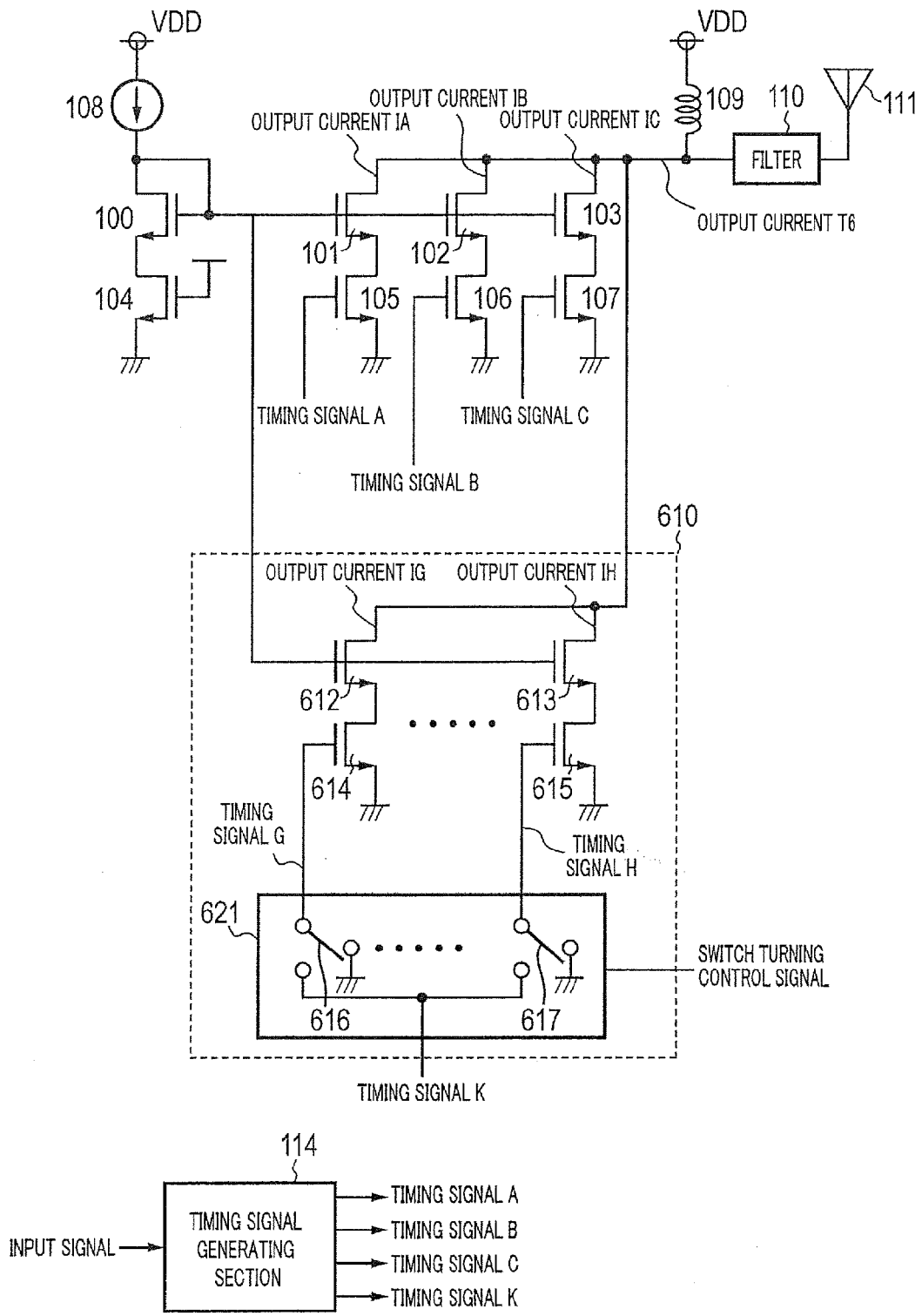
FIG. 8 is a configuration diagram of a power amplifier according to Embodiment 3 of the present invention.

FIG. 8 is a configuration diagram of a power amplifier according to Embodiment 3 of the present invention. In FIG. 8, similar elements to those in FIG. 1 are designated with the same reference numerals, and explanations thereof will be omitted.

The power amplifier of Embodiment 3 is provided by adding harmonic wave reduction circuit 610 for reducing a second harmonic wave component to a configuration similar to that in FIG. 1.

Harmonic wave reduction circuit 610 includes a plurality of sets of NMOS transistors 612, 613, 614, and 615, and switch group 621. NMOS transistors 612, 613, 614, and 615 and switches 616 and 617 of switch group 621 are illustrated as only two sets in FIG. 8, but may be provided as more than two sets; such as 4, 8, 16, and 32 sets. Alternatively, only one set may be provided.

NMOS transistors (corresponding to current sources for reduction in harmonic waves) 612 and 613 have gate terminals connected to the gate terminal of NMOS transistor 100, through which the reference current flows, and constitute a current mirror circuit. NMOS transistors 614 and 615 cause the flow of correction currents for reduction in harmonic waves, and these current values are low in comparison with the currents flowing through NMOS transistors 101, 102, and 103.

NMOS transistors (corresponding to switches for reduction in harmonic waves) 614 and 615 are connected between the ground and the source terminals of NMOS transistors 612 and 613, respectively, that serve as current sources, and function as switches that open and close these current paths.

Switch group (corresponding to a number switching section) 621 includes a plurality of switches 616 and 617 that individually switch between the operation and non-operation of a plurality of sets of NMOS transistors 612, 613, 614, and 615. More specifically, switches 616 and 617 open and close signal lines for sending timing signal K to the gate terminals of NMOS transistors 614 and 615, respectively. A plurality of switches 616 and 617 are turned on/off by a switch turning control signal. When switches 616 and 617 are open, the gate terminals of NMOS transistors 614 and 615 are connected to the ground so as to prevent the voltages of the gate terminals from being unfixed.

Timing signal generating section 114 generates timing signal K in addition to timing signals A to C. Timing signal generating section 114 outputs timing signal K to harmonic wave reduction circuit 610. Timing signal K corresponds to a timing signal for reduction in harmonic waves.

The connection and configuration of harmonic wave reduction circuit 610 will be more specifically described below.

The drain terminals of NMOS transistors 612 and 613 are connected to the input terminal of band pass filter 110. Output currents IG and IH flowing through NMOS transistors 612 and 613 are added to the total output current (IA+IB+IC) of NMOS transistors 101, 102, and 103 to correct output current T6 of the power amplifier.

The currents flowing through a plurality of NMOS transistors 612 and 613 of harmonic wave reduction circuit 610 are set so as to increase, for example, in this order according to the power of 2. For example, in the case of four transistors, the currents are set so as to increase according to 1:2:4:8. According to such setting, the operation/non-operation of a plurality of NMOS transistors 612 and 613 can independently be switched to thereby switch the current value added to output current T6 from harmonic wave reduction circuit 610 at constant intervals at multiple levels.

Figure 9:
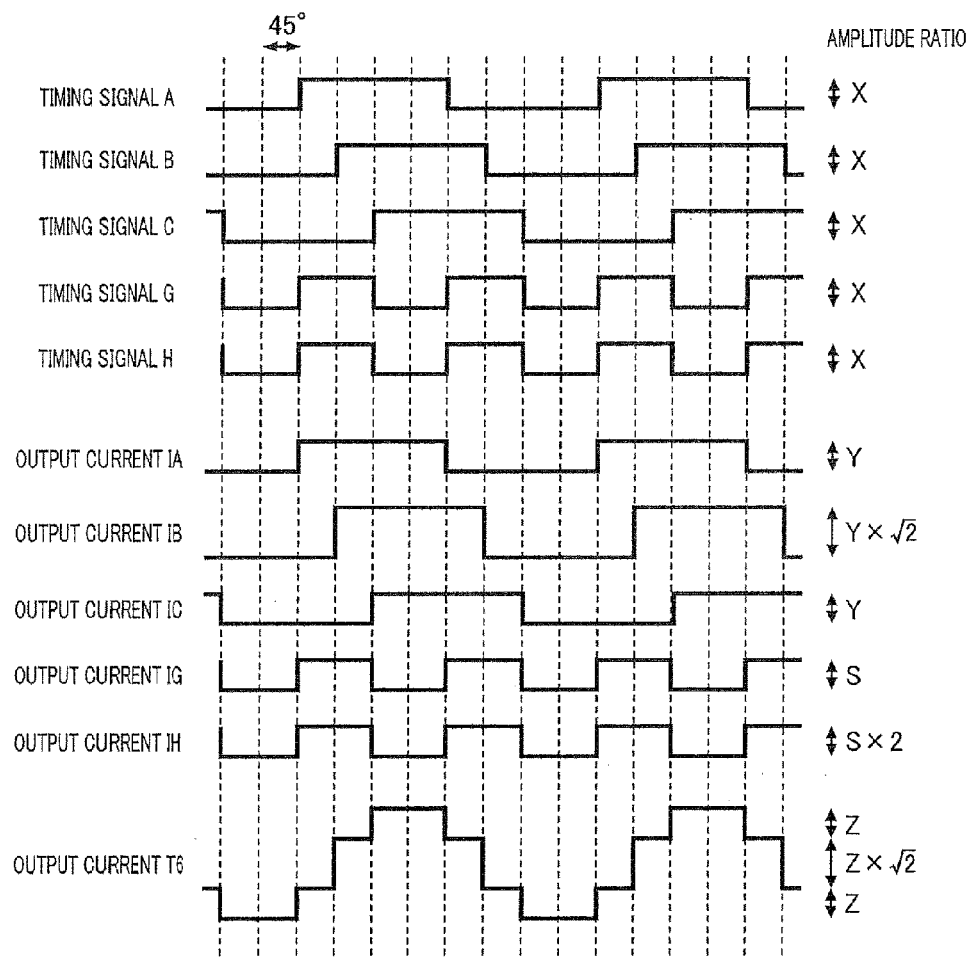
FIG. 9 is a timing chart illustrating an operation of the power amplifier of Embodiment 3 of the present invention.
Figure 10:
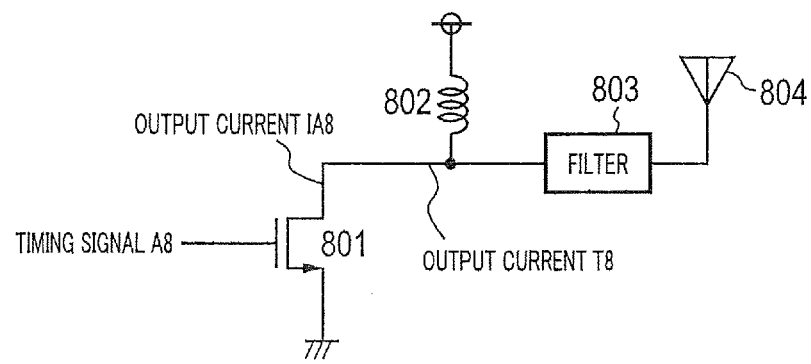
FIG. 10 is a configuration diagram of a conventional power amplifier.
Figure 11:
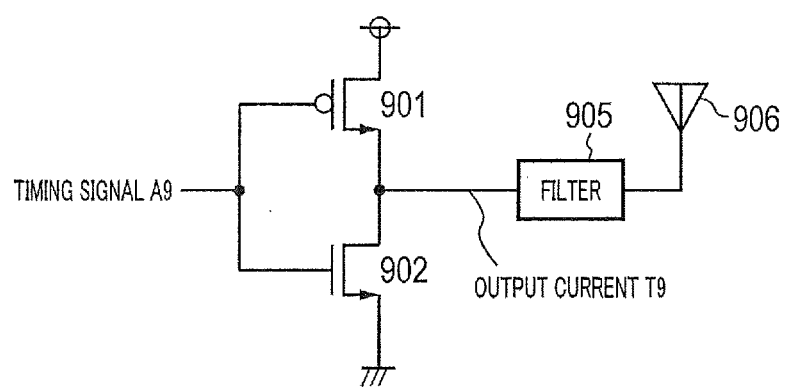
FIG. 11 is a configuration diagram of a first example of a conventional inverter type power amplifier.
Figure 12:
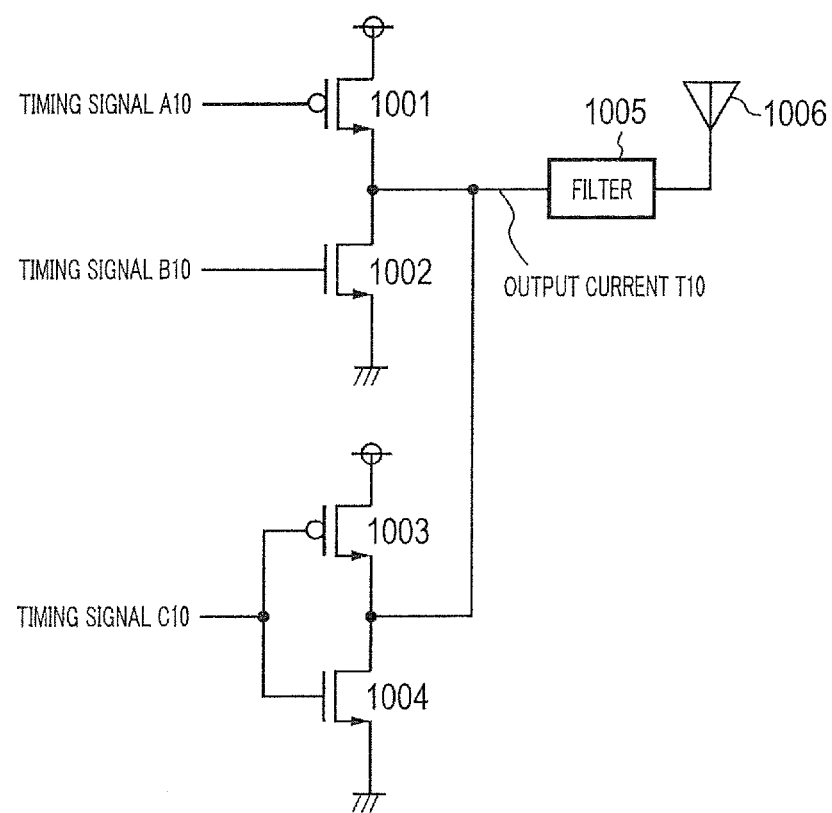
FIG. 12 is a configuration diagram of a second example of a conventional inverter type power amplifier.
Figure 13:
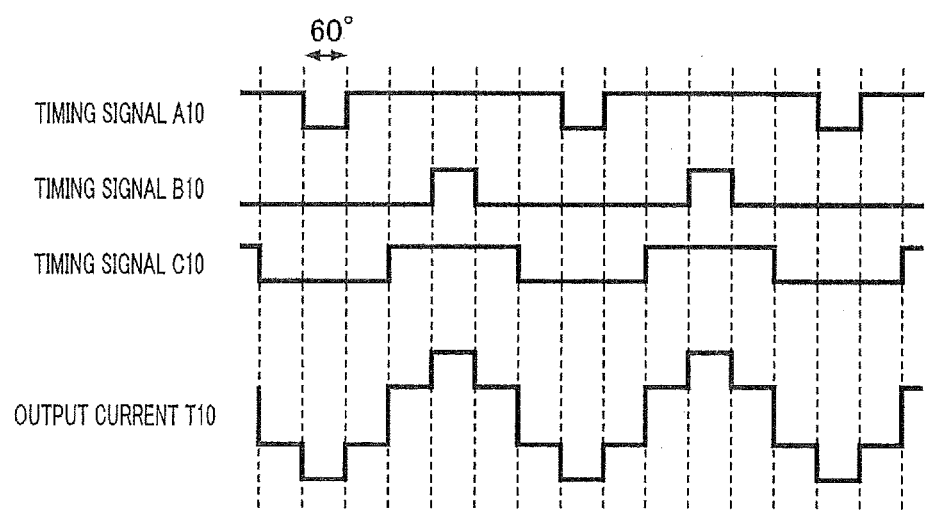
FIG. 13 is a timing chart illustrating an operation of the second example of the conventional inverter type power amplifier.

The W/L ratios of a plurality of NMOS transistors 612 and 613 are set to a ratio increasing in this order according to the power of 2. The W/L ratios of NMOS transistors 612 and 613 are set independently from the W/L ratios of NMOS transistors 101, 102, and 103 that output most of the output current of the power amplifier. That is, current amplitudes Y and S in FIG. 9 are set independently. Current amplitude S is sufficiently small in comparison with current amplitude Y.

Outputting/stopping of timing signals G and H for turning on/off NMOS transistors 612 and 613 is selected by turning on/off switches 616 and 617. According to this turning on/off, a current amount corrected by harmonic wave reduction circuit 610 can be changed to select a current amount having harmonic waves eliminated, according to the content of a second harmonic wave varying at each time point or in each apparatus. For example, when four transistors are provided as a plurality of NMOS transistors 612 and 613, the correction current of harmonic wave reduction circuit 610 can be switched at $2^4$ levels by a 4-bits switch turning control signal.

Timing signals G and H are signals provided by sending timing signal K, which is generated in timing signal generating section 114, through switches 616 and 617 to the gate terminals of NMOS transistors 614 and 615, respectively. Therefore, timing signals G and H are in-phase signals.

FIG. 9 is a timing chart illustrating the operation of the power amplifier of Embodiment 3.

Timing signal A, timing signal B, timing signal C, timing signal G, and timing signal H are signals for turning on/off NMOS transistors 105, 106, 107, 614, and 615, have the same amplitudes, and have different phases and frequencies.

Timing signal A, timing signal B, and timing signal C, are signals of the same frequency, and having phases shifted by 45 degrees in this order.

Timing signals G and H are mutually in-phase signals having a duty ratio of 50%. The phases of timing signal G and timing signal H are set so that output current IG and output current IH have opposite phases to twice the harmonic waves of a total signal of output current IA, output current IB, and output current IC.

For example, timing signals A, B, C, G and H have rising phases of 0, −45, −90, 0, and 0 degree, respectively.

The frequency of timing signal G and timing signal H is twice the frequency of timing signal A, timing signal B, and timing signal C.

The currents flowing through the drain terminals of NMOS transistors 101, 102, 103, 612, and 613 have waveforms indicated as output currents IA, IB, IC, IG, and IH, respectively, as illustrated in FIG. 9. Since the W/L ratios of NMOS transistors 101, 102, 103, 612, and 613 are set as Y:($2^{1/2}$×Y):Y:S:(2×S), the currents are also set as Y:($2^{1/2}$×Y):Y:S:(2×S). In this case, value Y and value S are set independently.

Output current T6 has a waveform of a total of currents through NMOS transistors 101, 102, 103, 612, and 613. The waveform of output current T6 is found to have a spectrum indicating that the third and fifth harmonic wave components are reduced similarly to Embodiment 1 and that the second harmonic wave component is further reduced by adding signal having opposite phases to twice the harmonic waves.

As described above, the power amplifier of Embodiment 3 can reduce the second harmonic wave component in addition to odd-order harmonic wave components without using timing signals having different duty ratios. Moreover, the power amplifier of Embodiment 3 can output high electric power by the open drain configuration, in comparison with an inverter type power amplifier including NMOS transistors and PMOS transistors.

(Embodiment 4)

Figure 14:
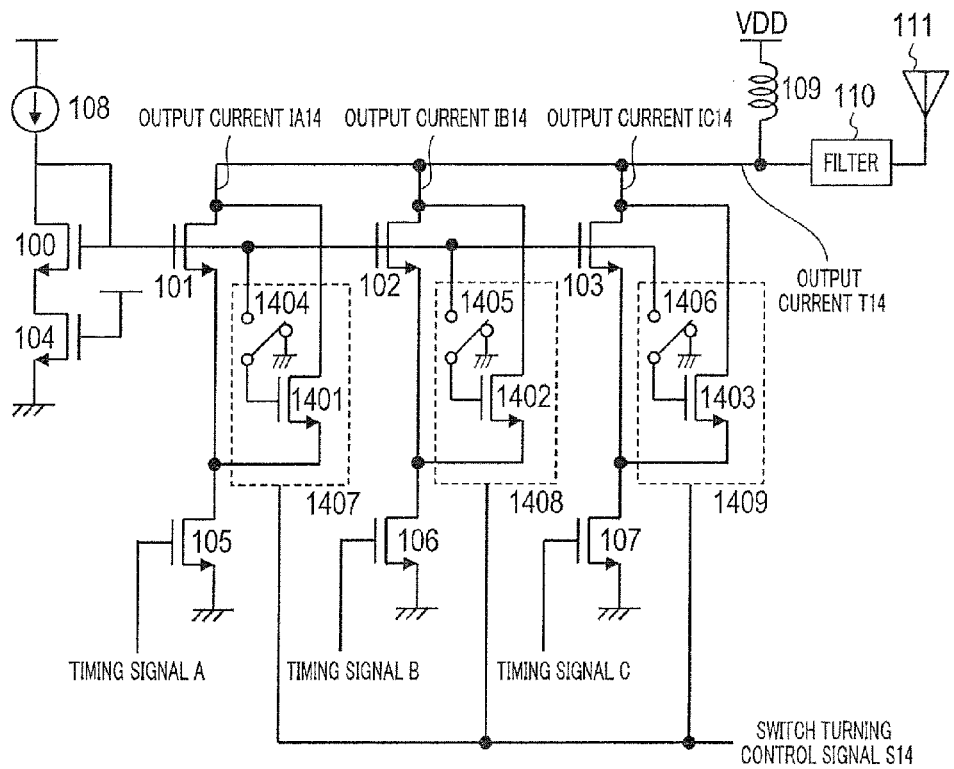
FIG. 14 is a configuration diagram of a power amplifier according to Embodiment 4 of the present invention.

FIG. 14 is a configuration diagram of a power amplifier according to Embodiment 4 of the present invention. In FIG. 14, similar elements to those in FIG. 1 are assigned the same reference numerals, and explanations thereof will be omitted.

As illustrated in FIG. 14, the power amplifier of Embodiment 4 further includes, in addition to a similar configuration in FIG. 1, fine adjustment circuits 1407, 1408, and 1409 in order to prevent a decrease in the reduction amount of harmonic wave components due to a variation in the elements.

Fine tuning circuits 1407, 1408, and 1409 include NMOS transistors 1401, 1402, and 1403 and switches 1404, 1405, and 1406, respectively. When switches 1404, 1405, and 1406 are turned on, the gate terminal of NMOS transistor 100 through which a reference current flows is connected to the corresponding gate terminals to form current mirror circuits. When switches 1404, 1405, and 1406 are turned off, the gate terminals of NMOS transistors 1401, 1402, and 1403 are connected to the ground so as to prevent the voltages of the gate terminals from being unfixed. Switches 1404, 1405, and 1406 can be turned on/off to thereby adjust currents flowing as output currents IA14, IB14, and IC14. Individual switches are turned on/off by switch turning control signal S14 independently from one another.

Figure 15:
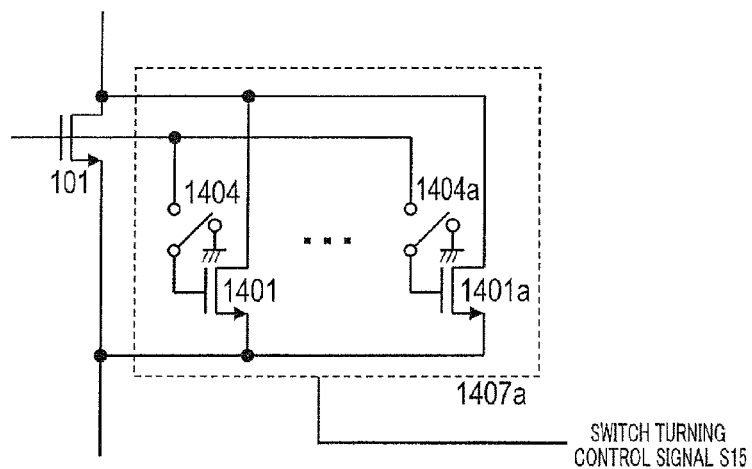
FIG. 15 is a configuration diagram of a fine adjustment circuit according to Embodiment 4 of the present invention.

In order to increase the adjustment width and the adjustment accuracy, a plurality of transistors may be provided in the fine adjustment circuit, and may be turned on/off with switches. FIG. 15 illustrates an example case involving the plurality of transistors and switches of fine adjustment circuit 1407 in FIG. 14. Fine adjustment circuit 1407a includes transistor 1401a connected to NMOS transistor 1401 in parallel, and the respective gates are connected to switches 1404 and 1404a. The W/L ratios of NMOS transistors 1401 and 1401a are set as a ratio increasing according to the power of 2 in this order, and the respective switches are enabled to be turned on/off independently.

According to this turning on/off, a current amount corrected by fine adjustment circuit 1407a can be changed to select a current amount having harmonic waves eliminated, according to the content of harmonic waves varying at each time point or in each apparatus. For example, when four transistors are provided as a plurality of NMOS transistors 1401 and 1401a, the correction current of fine adjustment circuit 1407a can be switched at $2^4$ levels by 4-bits switch turning control signal S15.

In the above explanation, fine adjustment circuit 1407 in FIG. 14 is taken as an example. However, in order to increase the adjustment width and the adjustment accuracy, a plurality of transistors for fine adjustment circuits are also provided in fine adjustment circuits 1408 and 1409 similarly, and may be turned on/off with switches.

As described above, the power amplifier of Embodiment 4 can make fine adjustments to the current amplitude of the constant current source, and can prevent a decrease in the reduction amount of harmonic wave components due to an error in a current amplitude caused by a variation in the elements and due to the phase error of the control signal for turning on/off the constant current source.

Each embodiment of the present invention has been described thus far.

In addition, the functional blocks used in the descriptions of the embodiments are typically implemented as LSI devices, which are integrated circuits. The functional blocks may be formed as individual chips, or a part or all of the functional blocks may be integrated into a single chip. The term "LSI" is used herein, but the terms "IC," "system LSI," "super LSI" or "ultra LSI" may be used as well depending on the level of integration.

In addition, the circuit integration is not limited to LSI and may be achieved by dedicated circuitry or a general-purpose processor other than an LSI. After fabrication of LSI, a field programmable gate array (FPGA), which is programmable, or a reconfigurable processor which allows reconfiguration of connections and settings of circuit cells in LSI may be used.

Should a circuit integration technology replacing LSI appear as a result of advancements in semiconductor technology or other technologies derived from the technology, the functional blocks could be integrated using such a technology. Another possibility is the application of biotechnology, for example.

The disclosure of the specification, the drawings, and the abstract included in Japanese Patent Application No. 2012-280974 filed on Dec. 25, 2012 is incorporated herein by reference in their entirety.

INDUSTRIAL APPLICABILITY

The present invention is used for power amplifiers for driving an antenna, for example.

REFERENCE SIGNS LIST 100, 101, 102, 103, 401, 402, 403 NMOS transistors (current sources, current mirror circuits)
105, 106, 107, 405, 406, 407 NMOS transistors (switches)
108 Reference current source
109 Coil
110 Band pass filter
111 Antenna
112, 113 Load adjustment MOS transistors
114 Timing signal generating section
120 Non-inverting section (first group)
301, 302, 303 Current sources
304, 305, 306 Switches
420 Balun
430 Inverting section (second group)
612, 613 NMOS transistors (current sources for reduction in harmonic waves)

614, 615 NMOS transistors (switches for reduction in harmonic waves)
1401, 1402, 1403 NMOS transistors
1404, 1405, 1406 Switches
1407, 1408, 1409 Fine adjustment circuits
A, B, C, D, E, F Timing signals
G, H, K Timing signals (timing signals for reduction in harmonic waves)

The invention claimed is:

1. A power amplifier comprising:
n current sources (where "n" is a natural number equal to or greater than 3) that cause predetermined currents to flow;
n switches that open and close current paths of the n current sources, respectively; and
a signal generating section that generates n timing signals according to an input signal, said n timing signals having an identical duty ratio and being different in phase, for turning on/off the n switches, respectively, wherein:
the power amplifier outputs a signal amplified in power based on the currents flowing through the n current sources.

2. The power amplifier according to claim 1, wherein the n current sources comprise:
a reference current source that causes a reference current to flow; and
n current mirror circuits that transfer the reference current.

3. The power amplifier according to claim 1, wherein the n switches are n MOS transistors.

4. The power amplifier according to claim 1, wherein the n is 3; and
the n timing signals are signals whose phases are shifted by 0, 45, and 90 degrees, respectively.

5. The power amplifier according to claim 1, wherein the n is 3; and
the n current sources have a current value ratio of $1:2^{1/2}:1$.

6. The power amplifier according to claim 3, wherein the n MOS transistors that are the n switches have constant channel lengths L, and channel widths W having sizes proportional to current values of the corresponding n current sources, respectively.

7. A power amplifier comprising:
n current sources (where "n" is a natural number equal to or greater than 3) that cause predetermined currents to flow;
n switches that open and close current paths of the n current sources, respectively;
a signal generating section that generates n timing signals for turning on/off the n switches, respectively; and
one or more load adjustment MOS transistors that have a gate terminal coupled with a gate terminal of one or more MOS transistors having a smaller size than the other MOS transistors among the n MOS transistors, wherein:
the n timing signals are signals that have an identical duty ratio and that are different in phase;
the power amplifier outputs a signal amplified in power based on the currents flowing through the n current sources;
the n switches are n MOS transistors;
the n MOS transistors that are the n switches have constant channel lengths L, and channel widths W having sizes proportional to current values of the corresponding n current sources, respectively;
the one or more load adjustment MOS transistors have drains and sources connected in a way that does not allow the currents to flow between the drains and the sources; and
loads of the gate terminals of the n MOS transistors are made substantially equal to each other by addition of a gate load of the load adjustment MOS transistors.

8. A power amplifier comprising:
n current sources (where "n" is a natural number equal to or greater than 3) that cause predetermined currents to flow;
n switches that open and close current paths of the n current sources, respectively; and
a signal generating section that generates n timing signals for turning on/off the n switches, respectively, wherein:
the n timing signals are signals that have an identical duty ratio and that are different in phase;
the power amplifier outputs a signal amplified in power based on the currents flowing through the n current sources;
the n is an even number equal to or greater than 6;
half of the n current sources, the n switches, and the n timing signals is categorized as a first group, and the remaining half thereof is categorized as a second group,
the first group and the second group operate in opposite phases, and
the power amplifier outputs a signal amplified in power based on a difference between a total current flowing through n/2 current sources in the first group and a total current flowing through n/2 current sources in the second group.

9. The power amplifier according to claim 8, wherein:
the n current sources include three current sources in a first group and three current sources in a second group;
the n switches include three switches in a first group corresponding to the three current sources in the first group and three switches in a second group corresponding to the three current sources in the second group; and
the n timing signals include three timing signals in a first group corresponding to the three switches in the first group and three timing signals in a second group corresponding to the three switches in the second group, wherein:
a ratio of current values of the three current sources in the first group is $1:2^{1/2}:1$;
a ratio of current values of the three current sources in the second group is $1:2^{1/2}:1$;
the three timing signals in the first group are signals whose phases are shifted by 0, 45, and 90 degrees, respectively;
the three timing signals in the second group are signals whose phases are shifted by 180, 225, and 270 degrees; and
the power amplifier outputs a signal amplified in power based on a difference between a total current flowing through the three current sources in the first group and a total current flowing through the three current sources in the second group.

10. A power amplifier comprising:
n current sources (where "n" is a natural number equal to or greater than 3) that cause predetermined currents to flow;
n switches that open and close current paths of the n current sources, respectively; and
a signal generating section that generates n timing signals for turning on/off the n switches, respectively;

harmonic-wave-reduction current sources that cause predetermined currents to flow;

harmonic-wave-reduction switches that open and close current paths of the harmonic-wave-reduction current sources; and a signal generating section that generates a harmonic-wave-reduction timing signal for turning on/off the harmonic-wave-reduction switches, wherein:

the n timing signals are signals that have an identical duty ratio and that are different in phase;

the power amplifier outputs a signal amplified in power based on the currents flowing through the n current sources;

a frequency of the harmonic-wave-reduction timing signal is twice the frequency of the timing signals; and currents of the harmonic-wave-reduction current sources are added to an output of the power amplifier.

11. The power amplifier according to claim 10, wherein the phase of the harmonic-wave-reduction timing signal is set as a phase for reducing a harmonic wave included in the signal amplified in power.

12. The power amplifier according to claim 10, further comprising a number switching section that selectively switches a number of current sources and a number of switches to be operated among the plurality of the harmonic-wave-reduction current sources and the plurality of the harmonic-wave-reduction switches.

\* \* \* \* \*